United States Patent

Planzo

[15] 3,659,035

[45] Apr. 25, 1972

[54] SEMICONDUCTOR DEVICE PACKAGE

[72] Inventor: Carmine Stephen Planzo, Onex-Geneva, Switzerland

[73] Assignee: RCA Corporation

[22] Filed: Apr. 26, 1971

[21] Appl. No.: 137,206

[52] U.S. Cl. ................................174/52 S, 29/588, 29/589, 29/590, 174/DIG. 3, 174/52 PE, 317/101 A, 317/101 CP, 317/234 G, 317/234 J

[51] Int. Cl. ........................................................H05k 5/00

[58] Field of Search ........................174/52 S, 52 PE, DIG. 3; 317/234 E, 234 F, 234 G, 234 J, 101 A, 101 CC, 101 CP; 29/588, 589, 590

[56] References Cited

UNITED STATES PATENTS 3,178,804 4/1965 Ullery, Jr. et al..............174/52 PE X
3,388,301 6/1968 James................................174/52 PE
3,436,604 4/1969 Hyltin et al. .....................317/101 CP

*Primary Examiner*—Darrell L. Clay
*Attorney*—Glenn H. Bruestle

[57] ABSTRACT

A construction for a semiconductor device in which a large number of closely spaced beam leads on a semiconductor chip are connected to external leads, including: an insulating substrate, a metallized pattern of conductors on the substrate, and a connector subassembly for coupling the beams on the chip to the conductors on the substrate. The connector subassembly comprises an insulating body having photolithographically formed beam leads in a diverging pattern thereon, adapted to connect to the chip at one end and to the conductive patterns at the other end thereof.

15 Claims, 11 Drawing Figures

PATENTED APR 25 1972 3,659,035

SHEET 1 OF 2

INVENTOR.
CARMINE S. PLANZO
BY
Robert P. Williams
ATTORNEY

PATENTED APR 25 1972

3,659,035

SHEET 2 OF 2

INVENTOR.
CARMINE S. PLANZO
BY
Robert P. Williams
ATTORNEY

SEMICONDUCTOR DEVICE PACKAGE

BACKGROUND OF THE INVENTION

This invention relates to semiconductor devices and more particularly to a package construction for an integrated circuit device. There are many approaches to the packaging of integrated circuit devices, that is, to the housing and protection of such devices and the provision of electrical connection to the outside. Techniques generally known as wire bonding, flip chip bonding, beam lead bonding, spider bonding, etc., have each been used with glass, ceramic, plastic and metal package constructions. The present invention is an improvement in the beam lead type of package.

A beam lead semiconductor device comprises a chip of semiconductor material having active and passive circuit elements formed therein with connections to the circuit elements in the form of relatively massive beam lead conductors extending in cantilevered fashion beyond the edges of the chip. The packages in general use for such devices include an insulating substrate, of ceramic material for example, having a printed pattern of conductors thereon and a plurality of external leads coupled to the printed conductors. The beam leads of the chip are bonded to the printed conductors and the package is closed with a metal or ceramic cap or an epoxy or silicone plastic or the like.

The complexity of integrated circuit devices and the number of connections to the semiconductor chips should be increasing rapidly because of the many new applications which are being found for these devices. Progress has been retarded, however, because the spacing of the conductors to which the beam leads are bonded cannot be made as small as the spacing between the beam leads. The problem is the same in hybrid devices in which more than one beam lead device is bonded to printed conductors on a single substrate.

In one known solution to this problem, a beam lead device or other semiconductor device having closely spaced terminals is connected to more widely spaced conductors by means of an intermediate connection assembly comprising an insulating substrate, of ceramic, plastic, or the like, having a diverging pattern of conductors thereon. In this arrangement, economy is lost because materials additional to those regularly on hand are required and modifications and additions to existing production equipment are necessary. Moreover, the several materials are not thermally compatible.

SUMMARY OF THE INVENTION

In the present construction, closely spaced beam leads on a chip are connected to more widely spaced conductors by means of an interconnection assembly which includes a plurality of diverging beam leads on a semiconductor body interposed between the chip and the more widely spaced conductors. The present novel method includes the step of forming the beam leads on the body by photolithographic methods.

THE DRAWINGS

DETAILED DESCRIPTION

Figure 2:
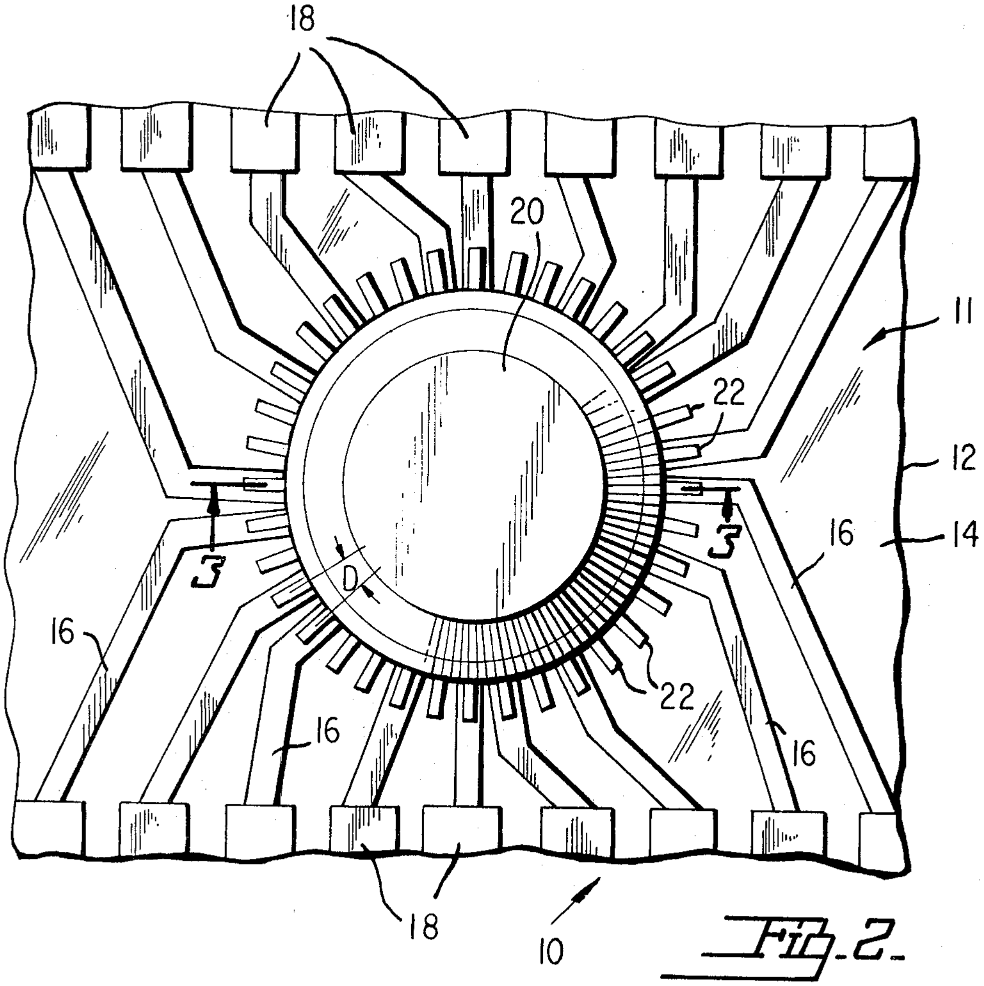
FIG. 2 is a partial plan view of the package of FIG. 1.

One form of the present novel integrated circuit package structure is indicated at 10 in the drawings. In this embodiment, the package 10 includes a terminal member 11 which comprises substrate 12 of glass, ceramic, or the like which carries on a surface 14 thereof a metallized pattern of conductors 16. The conductors 16 may be formed in conventional fashion by depositing conductive material through a mask in the desired pattern. One manner of forming the conductors 16 is by silk screen printing.

A plurality of external leads 18 are attached to the conductors 16, by brazing for example. The leads 18 are adapted to connect the device 10 to external circuitry such as conductors on a printed circuit board or the like.

Figure 1:
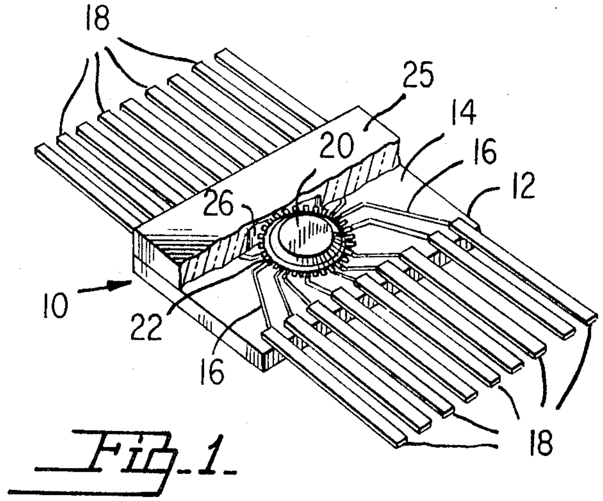
FIG. 1 is a perspective view, partially broken away, of the present novel package.
Figure 3:
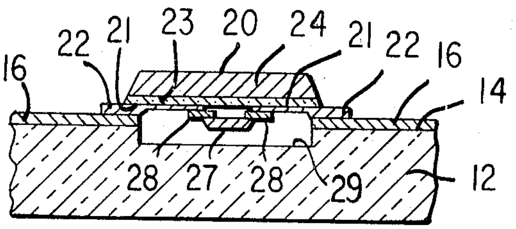
FIG. 3 is a cross sectional view on the line 3—3 of FIG. 2.

An interconnection assembly 20 shown in its relation to the other elements in FIGS. 1, 2, and 3, has a surface 21 which carries cantilevered beam leads 22. In this embodiment, the surface 21 is the surface of an insulating coating 23 on a body of semiconductive material 24, i.e. the insulating coating 23 lies between the semiconductor body 24 and the beam leads 22 for insulating the beam leads 22 from the semiconductor body 24. The distal ends of the beam leads 22 are adapted to be coupled to the conductors 16 on the substrate 12. The package may be closed by a ceramic cap member 25 FIG. 1 which has a recess 26 to accommodate the central elements of the package.

As shown in FIG. 3, there is a semiconductor device chip 27 which has a plurality of peripheral beam leads 28 thereon, the distal ends of which are attached to the proximal ends of the beam leads 22. The chip 27 is conventional and may be manufactured by any known beam lead technique. In the assembled relationship shown, the chip 27 is located beneath the assembly 20, disposed within a recess 29 in the substrate 12. The recess 29 has a predetermined area in the plane of the surface 14 and the conductors 16 terminate at the boundary of the recess. The size of the assembly 20 is large enough that the beam leads 22 may contact the conductors 16.

Figure 7:
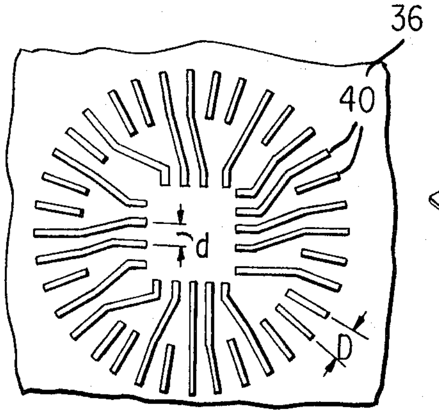

The beam leads 28 on the chip 27 have a center-to-center spacing which is smaller than the spacing "D" FIG. 2 which can be achieved between the conductors 16. The spacing between the beam leads 28 is the same as the spacing of the inner or proximal ends of the beam leads 22 as indicated in FIG. 7 by the letter "*d*." The beam leads 22 on the assembly 20 diverge from a spacing "*d*" near the center of the surface 21 to a peripheral spacing equal to the spacing "D" of the conductors 16. The plan configuration of one lead pattern on the assembly 20 is shown in FIG. 7.

Figure 4:
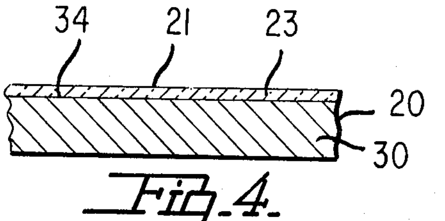
FIGS. 4 to 10 are a series of views, FIGS. 4 to 6 and 8 to 10 in cross section and FIG. 7 in plan, illustrating the method of manufacture of the interconnection assembly in the present novel package.

The assembly 20 is preferably fabricated of semiconductive material by substantially the same process as the chip 27. This allows the present novel package to be introduced into an existing factory equipped to manufacture beam lead devices without capital expenditure and without retraining of its personnel. One suitable process is illustrated in FIGS. 4 to 10.

Where the chosen semiconductive material is silicon, the process begins with a silicon wafer 30, a portion of which is shown in FIG. 4. For economy, the wafer 30 may be a rejected wafer from a device processing line although any silicon wafer will suffice. Other semiconductor materials may be used, but the material should be the same as that used for the chip 27 so that close matching of thermal expansion characteristics may be achieved. The first step in the present novel process is to form an insulating coating 23 on a surface 34 of the wafer 30. The outer surface 21 of the coating 23 carries the beam leads 22.

The oxidized wafer 30 is next coated with layers 36, 38, and 40, respectively of titanium, platinum or palladium and gold. See FIG. 5. These layers are deposited in conventional manner by evaporation of the respective metals in a vacuum. The titanium layer 36 may be about 2,000 to 5,000 A. thick, the platinum or palladium layer between about 1,500 and 5,000 A. thick, and the gold layer 40, 2,000 A. or more. A masking photoresist coating is next applied, indicated by the masking blocks 42 in FIG. 5 in the desired lead pattern. This pattern must be uniquely designed to accommodate the circuit of each particular device chip. While only one pattern is shown in the drawings, it will be understood that the pattern is repeated several times on the wafer 30, as in conventional batch fabrication processes.

Figure 6:
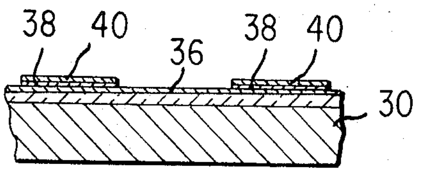

The exposed portions of the layers 40 and 38 are next removed by etching in a selective solvent for gold, platinum, and palladium, but not for titanium. For example, this solvent may be aqua regia. The result is shown in FIG. 6 where the titanium coating 36 is now shown as exposed in those areas which were not covered by the photoresist coating 42.

The plan pattern of the layers 38 and 40 may have an appearance as shown in FIG. 7. The materials which are visible in FIG. 7 are the titanium layer 36 and the gold layer 40. As shown, many of the conductors do not extend completely from the periphery to the central portion of the pattern. This arrangement aids in adapting the device to many different circuits on the chip 27. The designer may begin in each case with a circular pattern of the short peripheral conductors and selectively extend as many of them as he requires into the central portion of the pattern.

Figure 8:
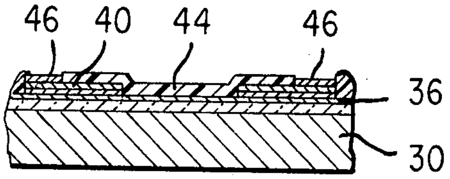
Figure 5:
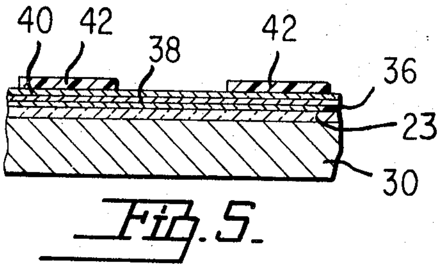
Figure 9:
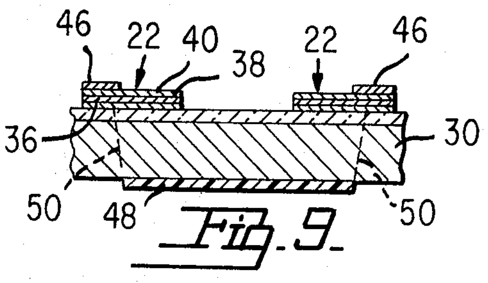

The next step in the present process is to plate up the outer ends of the conductors on the wafer 30. As shown in FIG. 8, this is accomplished by applying a non-conductive masking coating 44 wherever plating is not desired. The wafer 30 is then placed in a gold electrolytic plating bath; anode contact is made to the titanium layer 36; and a second gold layer 46 of a thickness of about 0.5 mils is plated on the gold coating 40. The masking coating 44 is then removed leaving the beam lead configuration shown in FIG. 9.

The back side of the wafer 30 may next be etched or ground to reduce its thickness. The step is not illustrated. Thereafter, an etch resistant coating 48 is applied on the back side of the wafer 30 (FIG. 9) and the wafer 30 is etched all the way through, substantially along the dashed lines 50 in FIG. 9 to separate the wafer into a plurality of the assemblies 20 and to establish the cantilevered relation of the beam leads 22. The fabrication of the assembly 20 is now complete.

Figure 10:
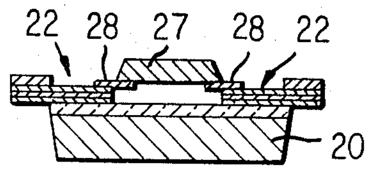

The beam leads 28 on the chip 27 are next bonded to the beam leads 22 in known fashion to provide the configuration shown in FIG. 10. The assembly is inverted, placed upon the conductors 16 and bonded thereto in the position shown in FIG. 3. Then the package is completed by applying the cap 25.

Figure 11:
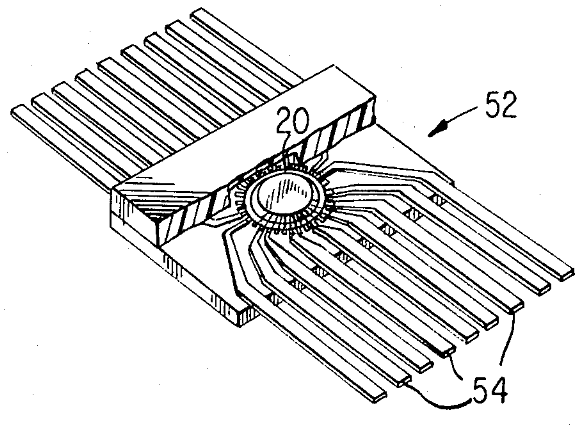
FIG. 11 is a partial perspective view of another embodiment of the present novel package.

An alternative embodiment of the present novel package is shown at 52 in FIG. 11. The package 52 differs from the package 10 in that a ceramic substrate is not employed. Instead, the conductors shown at 54, extend themselves into contact with the beam leads 22 on the assembly 20. In this package, the assembly as shown in FIG. 10 is inverted and bonded directly to the leads 54 after which the entire assembly is potted in a suitable moldable plastic material.

The present novel package is very economical since conventional materials are used and because rejected wafers may be employed as the material of the assembly 20. The spacing of the beam leads on the assembly 20 can be as small as the spacing of the beam leads 28 on the chip 27 because the same technology is used to form both sets of beam leads. The device is, therefore, a straightforward method of obtaining a large number of connections to a device chip.

What is claimed is:

1. A semiconductor device comprising:

a terminal member including a plurality of spaced conductors, an integrated circuit device including a semiconductor body and a plurality of cantilevered beam leads mounted on said body and extending therefrom, and a connector assembly including a semiconductor body and a plurality of cantilevered beam leads mounted thereon and extending therefrom, the distal ends of which are connected to said spaced conductors and the proximal ends of which are connected to the distal ends of the beam leads on said integrated circuit device.

2. A semiconductor device as defined in claim 1 wherein the semiconductor body of said connector assembly is the same material as that of the semiconductor body of said integrated circuit device.

3. A semiconductor device as defined in claim 2 wherein said connector assembly further includes an insulating coating on its semiconductor body between said semiconductor body and the beam leads thereon for insulating said beam leads from said semiconductor body.

4. A semiconductor device comprising means defining a plurality of conductors with a predetermined spacing therebetween, a semiconductor device chip having a plurality of cantilevered beam leads at the peripheral edge thereof, said beam leads having a predetermined spacing substantially less than the spacing of said conductors, and means for conductively connecting said beam leads to said conductors comprising a body of the same material as said chip having an insulating surface and having a plurality of beam leads on said insulating surface, said beam leads having inner ends near the central portion of said surface and outer ends in cantilevered relation to the periphery of said body, the spacing between said inner ends being substantially equal to the spacing of said beam leads on said chip and the spacing between said outer ends being substantially equal to the spacing of said conductors.

5. A semiconductor device as defined in claim 4 wherein said conductors are metallic leads adapted to be connected to external circuitry.

6. A semiconductor device as defined in claim 4 wherein said semiconductor device chip is silicon and wherein said insulating body comprises a body of silicon having an insulating coating of silicon dioxide thereon between said semiconductor body and the beam leads thereon for insulating said beam leads from said semiconductor body.

7. A semiconductor device as defined in claim 4 wherein the outer end of each of said beam leads on said body is relatively thicker than the inner end thereof.

8. A semiconductor device as defined in claim 7 wherein each of said beam leads on said body comprises superposed layers of evaporated titanium, platinum or palladium, and gold, the outer end of each beam lead having a plated layer of gold thereon.

9. A semiconductor device as defined in claim 4 wherein said conductors are deposited layers on an insulating substrate, said device further comprising a plurality of metallic leads connected to said conductors said leads extending beyond the periphery of said substrate and being adapted to be connected to external circuitry.

10. A semiconductor device as defined in claim 9 wherein said insulating substrate has a recess therein, said body being substantially larger than the area of said recess and being disposed in overlying relation to said recess, said semiconductor device chip being disposed within said recess.

11. A semiconductor device as defined in claim 10 wherein said semiconductor device chip is silicon and said body comprises a body of silicon having an insulating coating of silicon dioxide thereon between said semiconductor body and the beam leads thereon for insulating said beam leads from said semiconductor body.

12. A method of making a semiconductor device comprising the steps of forming a plurality of conductors having a predetermined spacing therebetween, forming a semiconductor device chip having a plurality of cantilevered beam leads at the peripheral edge thereof, said beam leads having a predetermined spacing substantially less than the spacing of said conductors, forming by photolithography, on a body of the same material as said chip having an insulating coating on a surface thereof, a plurality of beam leads having a spacing substantially equal to the spacing of said beam leads on said insulating coating on chip and the outer ends having a spacing substantially equal to that of said conductors, bonding said beam leads on said chip to said beam leads on said body, and bonding said beam leads on said body to said conductors.

13. A method as defined in claim 12 wherein said conductors are deposited layers on an insulating substrate and wherein said substrate has a recess in a surface thereof, said method comprising the further steps of performing the two bonding steps in the order stated and inverting said insulating body before bonding said beam leads on said body to said conductors, whereby said chip is disposed within said recess.

14. A method as defined in claim 12 wherein said semiconductor chip and said body are silicon and said insulating coating is formed on said body by thermally oxidizing a surface thereof.

15. A method as defined in claim 12 wherein said beam leads extend from locations near the center of said surface of said body into cantilevered relation with respect to the peripheral edge thereof, said beam leads being formed by, depositing a coating of titanium on said body, depositing a coating of platinum or palladium on said titanium coating, depositing a layer of gold on said platinum or palladium coating, applying a masking coating in the pattern of said beam leads to said gold layer, etching the gold and platinum or palladium with a selective etchant therefor from the unmasked areas, to delineate said beam leads, applying a second masking coating to leave only the outer ends of said beam leads exposed, electroplating a layer of gold on the outer ends of said beam leads, removing the photoresist coating, and etching the exposed titanium with a selective etchant therefor.

* * * * *